(12) United States Patent
Briere et al.

(10) Patent No.: US 8,063,613 B2
(45) Date of Patent: Nov. 22, 2011

(54) POWER CONVERTER DRIVER WITH SPLIT POWER SUPPLY

(75) Inventors: Michael A. Briere, Manhattan Beach, CA (US); Jason Zhang, Monterey Park, CA (US); HamidTony Bahramian, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 106 days.

(21) Appl. No.: 11/953,950

(22) Filed: Dec. 11, 2007

(65) Prior Publication Data
US 2008/0180083 A1     Jul. 31, 2008

Related U.S. Application Data

(60) Provisional application No. 60/869,400, filed on Dec. 11, 2006.

(51) Int. Cl.
*G05F 1/00* (2006.01)

(52) U.S. Cl. .................................................. 323/222

(58) Field of Classification Search .......... 323/222–225, 323/271, 282, 285, 289; 361/18, 190–192; 327/380, 381
See application file for complete search history.

(56) References Cited

U.S. PATENT DOCUMENTS

| | | | | |
|---|---|---|---|---|
| 5,010,261 A | * | 4/1991 | Steigerwald | 327/404 |
| 5,408,150 A | * | 4/1995 | Wilcox | 327/108 |
| 5,502,412 A | * | 3/1996 | Choi et al. | 327/333 |
| 6,211,706 B1 | * | 4/2001 | Choi et al. | 327/108 |
| 6,343,024 B1 | * | 1/2002 | Zabroda | 363/22 |
| 6,806,689 B2 | * | 10/2004 | Schuellein et al. | 323/272 |
| 6,897,492 B2 | * | 5/2005 | Ochi | 257/107 |
| 7,385,375 B2 | * | 6/2008 | Rozman | 323/224 |
| 7,518,430 B2 | * | 4/2009 | Dequina et al. | 327/381 |
| 2006/0279351 A1 | * | 12/2006 | Salato et al. | 327/524 |
| 2007/0097587 A1 | * | 5/2007 | Shirokoshi | 361/139 |
| 2008/0180083 A1 | * | 7/2008 | Briere et al. | 323/371 |

* cited by examiner

*Primary Examiner* — Adolf Berhane
*Assistant Examiner* — Yemane Mehari
(74) *Attorney, Agent, or Firm* — Farjami & Farjami LLP

(57) ABSTRACT

A power converter driver that is supplied with two different voltages.

23 Claims, 3 Drawing Sheets

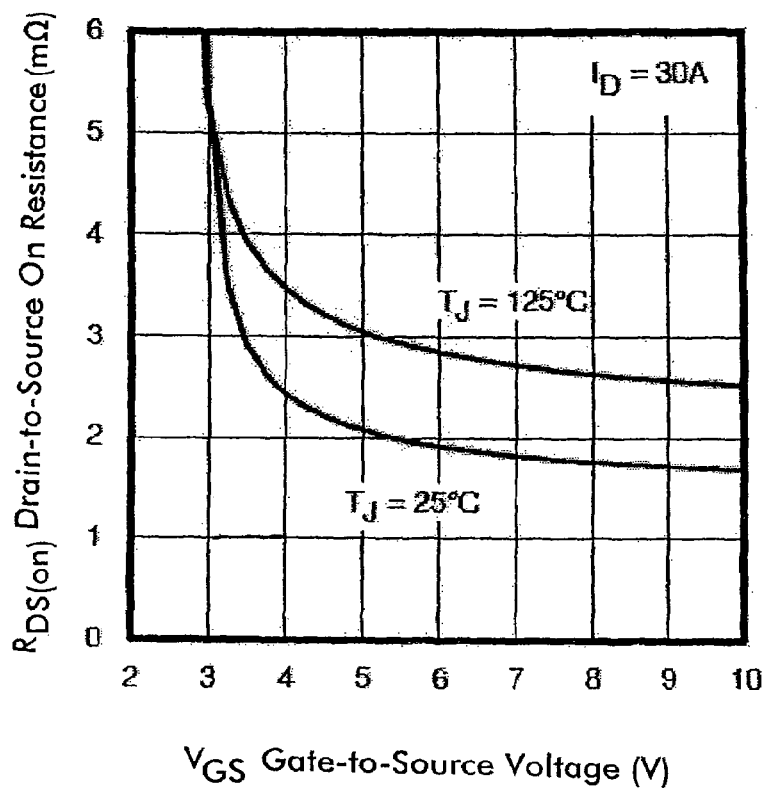
FIG. 3 On-Resistance vs. Gate Voltage
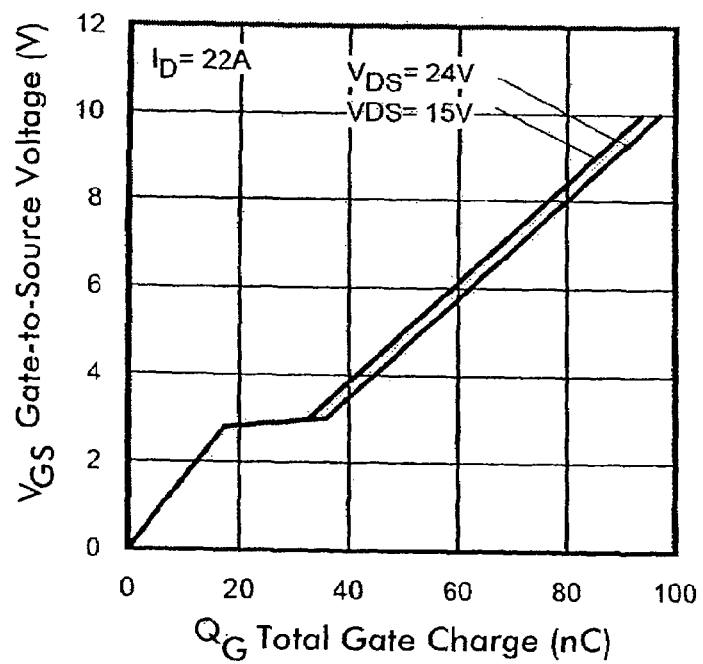
FIG. 4 Gate charge vs Gate Voltage

POWER CONVERTER DRIVER WITH SPLIT POWER SUPPLY

RELATED APPLICATION

This application is based on and claims priority to U.S. Provisional Application Ser. No. 60/869,400, filed on Dec. 11, 2006, entitled Split Power Supply for Buck Converter Improved Efficiency, to which a claim of priority is hereby made and the disclosure of which is incorporated by reference.

FIELD OF INVENTION

The present application relates to power converters, and more specifically to drivers that drive the power stage of a power converter.

BACKGROUND AND SUMMARY OF THE INVENTION

DC-DC power converters are used in many power management and supply applications, including, for example, power supply for portable devices such as laptop computers, cell phones, PDAs and the like. In power management and supply applications efficiency of the converter is an important parameter. In power supply applications for portable devices, for example, better efficiency results in longer battery life and/or a smaller battery. Thus, it is desirable to improve the efficiency of a power converter.

In a method according to the present invention, the power supply of the gate driver is split into two distinct power voltages with different values (Vcc and PVcc). This improves driver speed without adding gate charge losses, and hence improves the efficiency.

In a preferred method according to the present invention, the driver of the power stage receives power from two voltage sources, one supplying a higher voltage and the other supplying a lower voltage. Thus, the driver will produce two output voltages, one lower than the other.

According to one aspect of the present invention the lower output voltage is used to drive the gate of the switch in a power stage of the converter having the larger gate to source capacitance in order to reduce losses. Thus, in the preferred embodiment, the lower output voltage of the driver is used to drive the synchronous FET of a buck converter, which is typically the switch having the larger gate to source capacitance, thereby reducing power loss.

Other features and advantages of the present invention will become apparent from the following description of the invention which refers to the accompanying drawings.

BRIEF DESCRIPTION OF THE FIGURES

FIG. 3 graphically illustrates the Rdson (ON resistance) of a power MOSFET vs. the gate charge thereof.

FIG. 4 graphically illustrates gate charge of a power MOSFET vs. the applied gate voltage.

DETAILED DESCRIPTION OF THE FIGURES

Figure 1:
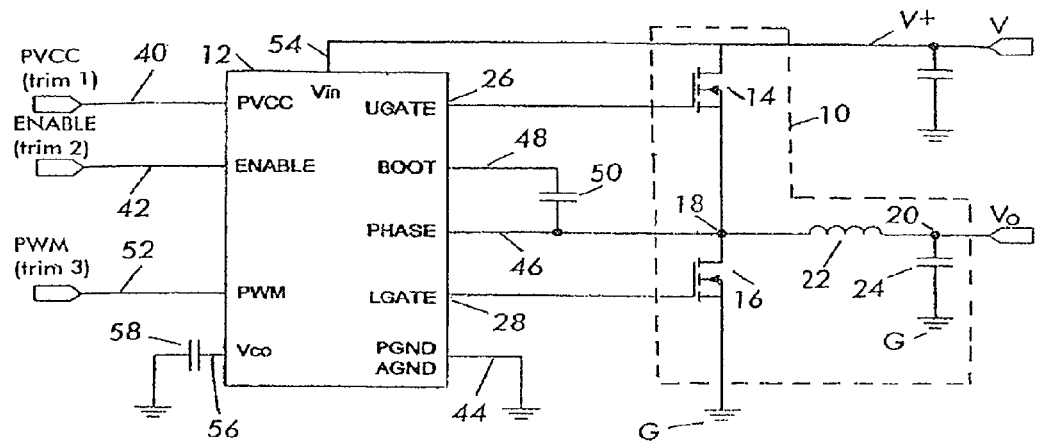
FIG. 1 schematically illustrates a power converter that includes a driver according to the present invention.

Referring to FIG. 1, in the preferred embodiment of the present invention, a buck converter 10 is coupled to a driver 12. Buck converter 10 includes a high side switch (control switch) 14, which may be a power MOSFET, series connected with a low side switch (synchronous rectifier) 16, which may also be a power MOSFET, to form a half-bridge circuit that is coupled between an input voltage V+ and ground G. The switched node 18 of the half-bridge is coupled to the output 20 of the buck converter through an output circuit that includes an output inductor 22 series connected between switched node 18 and output node 20, and output capacitor 24 connected between output node 20 and ground G.

Driver 12 includes high side drive signal pin 26 which is electrically coupled to the gate of high side switch 14 to send drive signals to the same, and low side drive signal pin 28 electrically coupled to the gate of low side switch 16 to send drive signals to the same. Drive signals for pins 26, 28 are generated by respective high side and low side drivers.

According to one aspect of the present invention, driver 12 includes two different power supply sources each for operating a portion thereof. Specifically, one of the power supplies (Vcc) has a higher voltage than the other (PVcc)

Driver 12, according to the preferred embodiment, further includes PVcc pin 40 for receiving power from an external power source, enable pin 42 for receiving an enable signal, PWM pin 52 for receiving pulse width modulated signals from an external signal source, ground pin 44 for providing reference to ground voltage, phase pin 46 to couple to switched node 18, and bootstrap pin 48 for coupling to the high side of an externally positioned bootstrap capacitor 50. Note that in the preferred arrangement the low side of bootstrap capacitor 50 is referenced to switched node 50.

According to one aspect of the present invention, voltage Vcc is generated by driver 12 from, for example, input voltage V+. Thus, a pin 54 is provided for connection to the input voltage V+. Note that a pin 56 may be provided for Vcc reference to ground through a capacitor 58.

Figure 2:
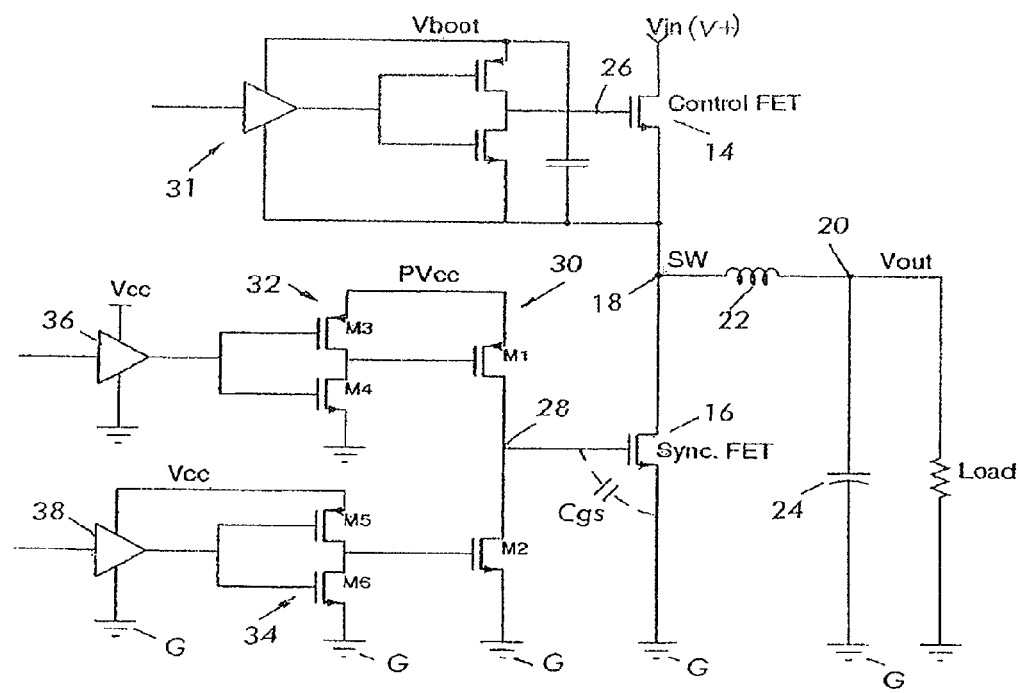
FIG. 2 illustrates a circuit diagram of a power converter that includes a low side driver powered according to an embodiment of the present invention.

Referring now to FIG. 2, a low side driver 30 includes a low side driver bridge comprised of series connected high side switch M1 (e.g. N-channel MOSFET), and low side switch M2 (e.g. P-channel MOSFET). The gate of high side switch M1 is coupled to the output node of predriver bridge 32 comprised of series connected high side switch M3 (e.g. N-channel MOSFET) and low side switch M4 (e.g. P-channel MOSFET). Similarly, the gate of low side switch M2 is coupled to the output node of a predriver bridge 34 comprised of series connected high side switch M5 (e.g. N-channel MOSFET) and low side switch M6 (e.g. P-channel MOSFET). The gates of switches M3, M4 of predriver bridge 32 are coupled to the output of a first predriver driver (e.g. an inverter) 36, while the gate of switches M5, M6 are coupled to the output of second predriver driver (e.g. an inverter) 38.

According to an aspect of the present invention, the low side driver bridge 30 is coupled between voltage source PVcc and ground G.

According to another aspect of the present invention, high side predriver bridge 32 may also be coupled between first voltage source PVcc and ground, while low side predriver bridge 34, first predriver driver 36 and second predriver driver 38 receive power from second voltage source Vcc.

It is well known that low side switch 16 needs to be pulled down by low side switch M2 of driver 30 as strong as possible to prevent switching losses such as CdV/dt induced turn-on loss. Conventionally, this is achieved by biasing both predriver bridges 32, 34 and driver bridge 30 with a single power supply rail (e.g. Vcc). Increasing the bias voltage for driving switch M2 will improve the pull down impedance due to increased gate voltage of M2, which is necessary to reduce switching loss of low side switch 16. However, at the same time, higher driving voltage for low side switch 16 will induce higher gate charge loss ($Cgs*Vcc^2*frequency$). These two effects cannot be decoupled; i.e. these two effects depend on one another. FIGS. 3 and 4 further explain these effects.

Moreover, the Rdson enhancement of low side switch 16 through increasing PVcc has diminishing return above certain gate drive voltages (about 5V), while the gate charge (Qg) still linearly increases with gate drive voltage. In other words, for low side switch 16, the total power loss will start to deteriorate above certain gate drive voltages.

In a method according to the present invention, driver output impedance (M2) can be independently reduced by increasing Vcc, while keeping the gate voltage of low side switch 16 unchanged at PVcc. By having a lower voltage (PVcc) at the output stage, the gate charge loss is reduced compared to the prior art method. In addition, a method according to the present invention allows the gate voltage of predriver transistors (M3-M6) to reach the higher value Vcc, therefore taking advantage of a higher drive capability.

Figure 5:
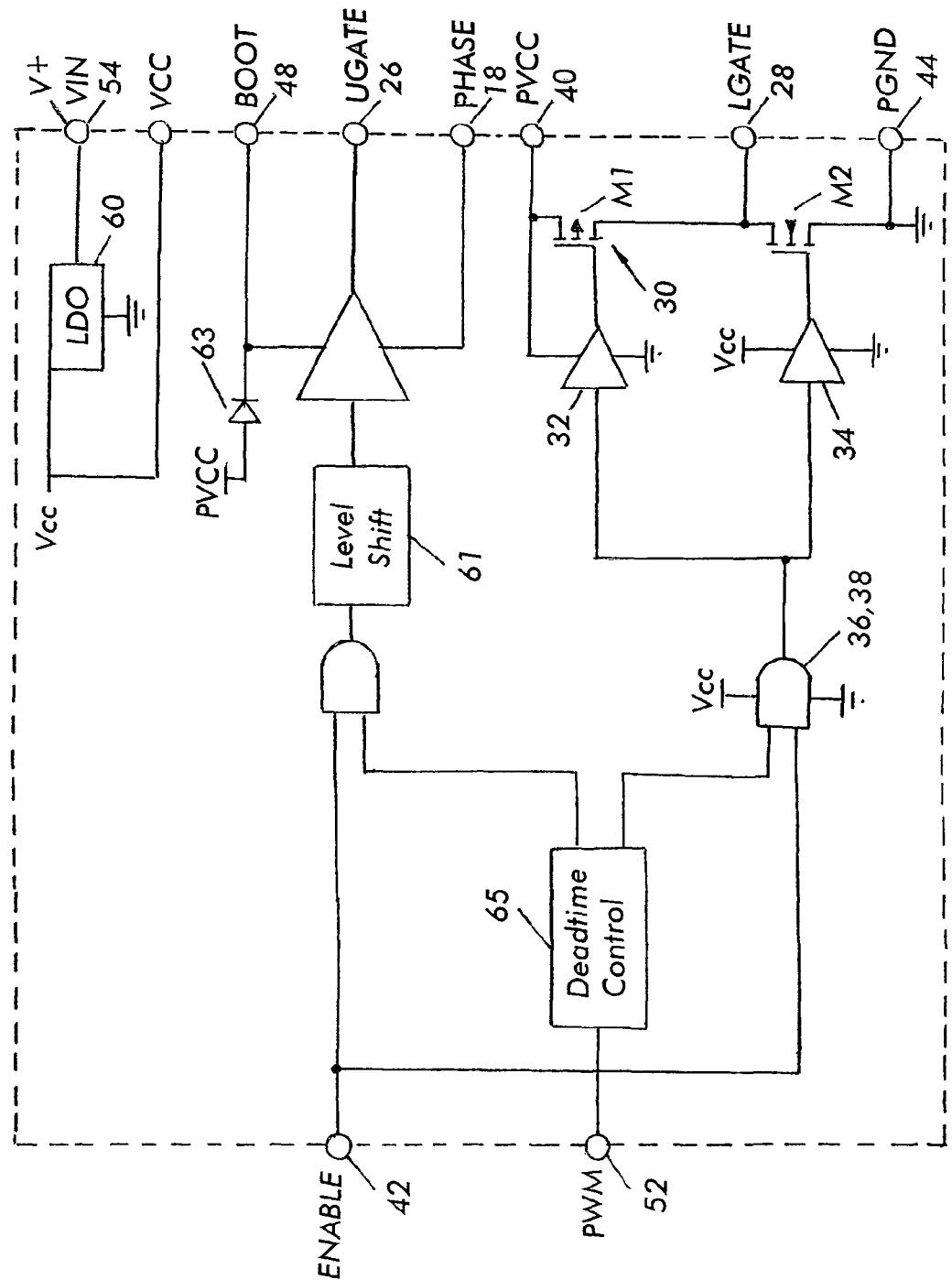
FIG. 5 schematically illustrates a driver according to an embodiment of the present invention.

In a typical power system, a 5 volt supply is readily available while a 6.5 voltage can be generated from input power V+, e.g. by a linear dropout regulator (LDO). Referring to FIG. 5, in which like numerals identify like features, in a preferred embodiment, Vcc is generated by driver 12, rather than being supplied from an external source. Thus, in the preferred embodiment, an LDO 60, which is coupled to receive input power V+ is used to derive voltage Vcc of driver 12.

Driving low side switch 16 with an externally available PVcc (e.g. 5 volts) reduces driver loss and significantly lifts the burden off LDO 60, thus improving efficiency. In addition, biasing NMOS predriver driver (M3-M6) with Vcc (e.g. 6.5V), will enhance driver sinking current capacity, while reducing C dv/dt and Qrr losses.

An arrangement according to the present invention also ensures that during start up, the low side PMOS M2 stays off when PVcc is available and Vcc is not.

Note that in FIG. 5, predriver drivers 36, 38 are represented as a single logic block, which can be part of the internal logics of a driver IC according to the present invention.

While high side driver can be powered by a different voltage than PVcc, the same dual bias scheme can be applied to drive high side switch 14, and also to other converter applications other than a buck converter. Note that the high side driver may be level shifted by level shift circuit 61. Note further that during the operation thereof, when voltage at switched node 18 reaches ground bootstrap diode 63 conducts to charge up bootstrap capacitor 50, and when the voltage at switched node 18 goes above ground bootstrap diode 61 stops conducting. A driver according to the preferred embodiment may further include a deadtime control circuit 65 for setting the deadtime between the high side switch and the low side switch of the converter.

It should be noted that while in the preferred embodiment PVcc is lower than Vcc, PVcc can be higher than Vcc depending on the type of IC devices used and the application.

It should also be noted that while the preferred embodiment is a driver for a converter, a method according to the present invention can be applied to all drivers including motor drivers or the like.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driver arrangement comprising:
    a high side driver to drive a high side switch of a half-bridge; and
    a low side driver to drive a low side switch of said half-bridge;
    said low side driver including a low side driver half-bridge having a high side driver switch and a low side driver switch;
    wherein a control voltage for said low side driver switch is supplied by a first voltage source, and another control voltage for said high side driver switch is supplied by a second voltage source with a voltage different from a voltage of said first voltage source.

2. The driver arrangement of claim 1, wherein said first voltage source has a voltage that is higher than a voltage of said second voltage source.

3. The driver arrangement of claim 1, wherein said low side switch is a synchronous switch of a buck converter.

4. The driver arrangement of claim 1, wherein said first voltage source has a voltage that is 6.5 volts and said second voltage source has a voltage that is five volts.

5. The arrangement of claim 1, wherein said low side driver half-bridge is connected between said second voltage source and a ground voltage, and wherein said high side driver switch is coupled to a predriver which is supplied by said first voltage source.

6. The arrangement of claim 1, wherein said half-bridge is coupled between a bus voltage and ground, one of said first and second voltage sources is supplied from an external source, and the other one of said first and second voltage sources is derived from said bus voltage.

7. The arrangement of claim 6, wherein said second voltage source is supplied from an external source and said first voltage source is derived from said bus voltage.

8. The arrangement of claim 7, wherein a linear drop out regulator is used to derive said first voltage source.

9. The arrangement of claim 6, wherein a linear drop out regulator is used to derive said second voltage source.

10. A driver arrangement for driving a power semiconductor switch, said driver arrangement comprising:
    a driver circuit including a driver half-bridge having a high side driver switch and a low side driver switch, said driver half-bridge coupled between a voltage source and ground; and
    a predriver driver circuit supplied with another voltage source;
    said voltage source supplying a control voltage for said high side driver switch, and said another voltage source supplying another control voltage for said low side driver switch.

11. The driver arrangement according to claim 10, wherein a voltage of said voltage source is less than a voltage of said another voltage source.

12. The driver arrangement of claim 10, wherein said voltage source is supplied from an external voltage source and said another voltage source is derived from a bus voltage.

13. The driver arrangement of claim 12, wherein said another voltage source is derived using a linear drop out regulator.

14. The driver arrangement of claim 10, wherein a predriver associated with said high side switch of said half-bridge is supplied with said another voltage source.

15. The driver arrangement of claim 10, wherein said driver is coupled to a switch of a half-bridge.

16. The driver arrangement of claim 15, wherein said switch of said half-bridge is a low side switch.

17. The driver arrangement of claim 15, wherein said switch of said half-bridge is a synchronous switch of a buck converter.

18. A driver arrangement comprising:
   a high side pre-driver to drive a high side switch of a driver, said high side pre-driver coupled between a first voltage source and ground; and
   a low side pre-driver to drive a low side switch of said driver, said low side pre-driver coupled between a second voltage source and ground, said second voltage source having a voltage different from a voltage of said first voltage source;
   said first voltage source supplying a control voltage for said high side switch of said driver, and said second voltage source supplying another control voltage for said low side switch of said driver.

19. The driver arrangement of claim 18, wherein a voltage of said second voltage source is higher than a voltage of said first voltage source.

20. The driver arrangement of claim 18, wherein a voltage of said second voltage source is 6.5 volts and a voltage of said first voltage source is five volts.

21. The driver arrangement of claim 18, further comprising a high side pre-driver driver and a low side pre-driver driver each supplied by said second voltage source.

22. The driver arrangement of claim 18, wherein said driver is configured to drive a switch of a half-bridge.

23. The driver arrangement of claim 22, wherein said half-bridge is a part of a power block of a buck converter.

* * * * *